United States Patent
Li et al.

(10) Patent No.: US 11,538,864 B2
(45) Date of Patent: Dec. 27, 2022

(54) DOUBLE-SIDED DISPLAY PANEL AND MANUFACTURE METHOD THEREOF, AND DOUBLE-SIDED DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Zongxiang Li, Beijing (CN); Liqing Yao, Beijing (CN); Jiamin Liao, Beijing (CN); Xinmao Qiu, Beijing (CN); Wenchang Tao, Beijing (CN); Zhendian Wu, Beijing (CN); Dahai Li, Beijing (CN); Guichun Hong, Beijing (CN); Changhong Shi, Beijing (CN)

(73) Assignees: FUZHOU BOE OPTOELECTRONICS TECHNOLOGY CO., LTD., Fujian (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 433 days.

(21) Appl. No.: 16/490,194

(22) PCT Filed: Mar. 21, 2019

(86) PCT No.: PCT/CN2019/079081
§ 371 (c)(1),
(2) Date: Aug. 30, 2019

(87) PCT Pub. No.: WO2019/237786
PCT Pub. Date: Dec. 19, 2019

(65) Prior Publication Data
US 2022/0005882 A1 Jan. 6, 2022

(30) Foreign Application Priority Data

Jun. 15, 2018 (CN) .......................... 201810620573.2

(51) Int. Cl.
*H01L 27/32* (2006.01)
*H01L 51/52* (2006.01)
*H01L 51/56* (2006.01)

(52) U.S. Cl.
CPC ........ *H01L 27/3218* (2013.01); *H01L 27/322* (2013.01); *H01L 27/3246* (2013.01);
(Continued)

(58) Field of Classification Search
CPC ....... H01L 27/14654; H01L 27/146543; H01L 27/14623; H01L 27/14605; H01L 27/14621; H01L 27/14627; H01L 27/1463
See application file for complete search history.

(56) References Cited

U.S. PATENT DOCUMENTS 10,388,234 B2    8/2019  Zhang et al.
10,564,440 B2 *  2/2020  Zhang .................. G02F 1/1333
(Continued)

FOREIGN PATENT DOCUMENTS

CN    1719957 A    1/2006
CN    101729488 A  6/2010
(Continued)

OTHER PUBLICATIONS

The First Chinese Office Action dated Feb. 4, 2021; Appln. No. 201810620573.2.

*Primary Examiner* — Jarrett J Stark

(57) ABSTRACT

A double-sided display panel and a manufacture method thereof, and a double-sided display device are provided. The double-sided display panel includes a first display layer and a second display layer which are disposed opposite to each other; the first display layer includes a plurality of first pixel
(Continued)

units and a plurality of first light adjusting components; the second display layer includes a plurality of second pixel units and a plurality of second light adjusting components; colors of light transmitted by a first light adjusting component and a second light adjusting component which are correspondingly stacked are different.

16 Claims, 6 Drawing Sheets

(52) U.S. Cl.
CPC ...... *H01L 27/3262* (2013.01); *H01L 27/3267* (2013.01); *H01L 27/3276* (2013.01); *H01L 51/5234* (2013.01); *H01L 51/5237* (2013.01); *H01L 51/5271* (2013.01); *H01L 51/5275* (2013.01); *H01L 51/56* (2013.01)

(56) References Cited

U.S. PATENT DOCUMENTS

| | | | |
|---|---|---|---|
| 10,811,453 B1* | 10/2020 | Mun | H01L 27/1463 |
| 2007/0132379 A1* | 6/2007 | Huang | H01L 27/3248 |
| | | | 313/506 |
| 2010/0308353 A1* | 12/2010 | Grabowski | H01L 51/5278 |
| | | | 257/E33.044 |
| 2011/0169027 A1* | 7/2011 | Park | H01L 33/42 |
| | | | 257/E33.068 |
| 2013/0200380 A1 | 8/2013 | Chang et al. | |
| 2014/0252336 A1* | 9/2014 | Kobayashi | H01L 27/3267 |
| | | | 257/40 |
| 2014/0306204 A1* | 10/2014 | Niu | H01L 51/56 |
| | | | 438/23 |
| 2015/0077316 A1* | 3/2015 | Sato | G02F 1/1362 |
| | | | 345/77 |
| 2016/0329381 A1* | 11/2016 | Xu | G02F 1/157 |
| 2016/0358541 A1 | 12/2016 | Li et al. | |
| 2017/0148860 A1* | 5/2017 | Park | H01L 27/3248 |
| 2017/0285358 A1 | 10/2017 | Zhang | |
| 2018/0277580 A1* | 9/2018 | Chiang | H01L 27/14627 |
| 2021/0074751 A1* | 3/2021 | Bonakdar | H01L 27/14627 |
| 2021/0151482 A1* | 5/2021 | Phan | H01L 27/14621 |
| 2021/0202546 A1* | 7/2021 | Liu | H01L 27/14627 |

FOREIGN PATENT DOCUMENTS

| | | | | |
|---|---|---|---|---|
| CN | 103247656 A | | 8/2013 | |
| CN | 103855267 A | * | 6/2014 | |
| CN | 104020604 A | | 9/2014 | |
| CN | 104391407 A | | 3/2015 | |
| CN | 104808350 A | | 7/2015 | |
| CN | 105807513 A | | 7/2016 | |
| CN | 106444184 A | | 2/2017 | |
| CN | 107275373 A | | 10/2017 | |
| CN | 107534072 A | * | 1/2018 | ............. H01L 33/32 |
| JP | 2006215256 A | | 8/2006 | |
| JP | 2008077090 A | * | 4/2008 | ........ G02F 1/133514 |

* cited by examiner

DOUBLE-SIDED DISPLAY PANEL AND MANUFACTURE METHOD THEREOF, AND DOUBLE-SIDED DISPLAY DEVICE

CROSS-REFERENCE TO RELATED APPLICATION

The present application claims priority of Chinese Patent Application No. 201810620573.2, filed on Jun. 15, 2018, the disclosure of which is incorporated herein by reference in its entirety as part of the present application.

TECHNICAL FIELD

The embodiments of the present disclosure relate to a double-sided display panel and a manufacture method thereof, and a double-sided display device.

BACKGROUND

At present, a conventional display device can only perform single-sided display, and a user can only see the display content of the display device from one side of the display device. However, a display range of the single-sided display is limited, in some special scenarios, the display range cannot meet the needs of the user. For example, in an exhibition in a large space, due to the large number of exhibitors, the display range of the single-sided display does not provide a good user experience. At this situation, the exhibitors hope to watch the video playback of the exhibits from both sides of the display device. In this case, the two-side display can only be performed by combining two display devices, and this method is not only expensive, but also requires a large space and is not beautiful.

SUMMARY

At least one embodiment of the present disclosure provides a double-sided display panel, which comprises a first display layer and a second display layer which are disposed opposite to each other. The first display layer comprises: a plurality of first pixel units arranged periodically and a plurality of first light adjusting components which are stacked in one-to-one correspondence with the plurality of first pixel units, the plurality of first pixel units are configured to emit first monochromatic light or white light comprising the first monochromatic light, and the plurality of first light adjusting components corresponding to the plurality of first pixel units are configured to transmit only the first monochromatic light or the first monochromatic light in the white light. The second display layer comprises: a plurality of second pixel units arranged periodically and a plurality of second light adjusting components which are stacked in one-to-one correspondence with the plurality of second pixel units, the plurality of second pixel units are configured to emit second monochromatic light or white light comprising the second monochromatic light, and the plurality of second light adjusting components corresponding to the plurality of second pixel units are configured to transmit only the second monochromatic light or the second monochromatic light in the white light.

For example, in the double-sided display panel provided by at least one embodiment of the present disclosure, the plurality of first pixel units are stacked in one-to-one correspondence with the plurality of second pixel units. Respective one first pixel unit, of the plurality of first pixel units, and respective one second pixel unit, of the plurality of second pixel units, which are correspondingly stacked emit monochromatic light of different colors, respectively, a color of monochromatic light capable of being transmitted by a first light adjusting component which is correspondingly stacked with the first pixel unit and a color of monochromatic light capable of being transmitted by a second light adjusting component which is correspondingly stacked with the second pixel unit are different, the first light adjusting component is configured to allow first monochromatic light emitted by the first pixel unit to pass through, and the second light adjusting component is configured to allow second monochromatic light emitted by the second pixel unit to pass through.

For example, the double-sided display panel provided by at least one embodiment of the present disclosure further comprises a base substrate, the first light adjusting component, the first pixel unit, the second pixel unit, and the second light adjusting component are sequentially stacked on the base substrate.

For example, in the double-sided display panel provided by at least one embodiment of the present disclosure, the first light adjusting component is further configured to reflect light of other colors except the first monochromatic light emitted by the first pixel unit corresponding to the first light adjusting component; and the second light adjusting component is further configured to reflect light of other colors except the second monochromatic light emitted by the second pixel unit corresponding to the second light adjusting component.

For example, in the double-sided display panel provided by at least one embodiment of the present disclosure, the first light adjusting component comprises a photonic crystal, a grating light valve, or a color filter; and the second light adjusting component comprises a photonic crystal, a grating light valve, or a color filter.

For example, in the double-sided display panel provided by at least one embodiment of the present disclosure, the photonic crystal comprises a first matrix and a plurality of columnar structures periodically disposed in the first matrix, and a refractive index of the first matrix is different from refractive indexes of the plurality of columnar structures.

For example, in the double-sided display panel provided by at least one embodiment of the present disclosure, a plane shape and a plane size of a light-emitting layer of a light-emitting component of the first pixel unit are respectively substantially same as a plane shape and a plane size of a light-emitting layer of a light-emitting component of the second pixel unit which is correspondingly stacked with the first pixel unit; a plane size of the first light adjusting component is larger than the plane size of the light-emitting layer of the light-emitting component of the first pixel unit which is correspondingly stacked with the first light adjusting component, and a plane size of the second light adjusting component is larger than the plane size of the light-emitting layer of the light-emitting component of the second pixel unit which is correspondingly stacked with the second light adjusting component.

For example, in the double-sided display panel provided by at least one embodiment of the present disclosure, the plurality of first pixel units of the first display layer comprise a plurality of first red pixel units, a plurality of first green pixel units, and a plurality of first blue pixel units, the plurality of first red pixel units, the plurality of first green pixel units, and the plurality of first blue pixel units are arranged in an array, and colors of two adjacent first pixel units are different; and the plurality of second pixel units of the second display layer comprise a plurality of second red pixel units, a plurality of second green pixel units, and a plurality of second blue pixel units, the plurality of second red pixel units, the plurality of second green pixel units, and the plurality of second blue pixel units are arranged in an array, and colors of two adjacent second pixel units are different.

For example, in the double-sided display panel provided by at least one embodiment of the present disclosure, the plurality of first pixel units comprises a plurality of rows of pixel units, every three adjacent first pixel units is a repeating unit, a first one pixel unit in each repeating unit is a green pixel unit, a second one pixel unit in each repeating unit is a blue pixel unit, and a third one pixel unit in each repeating unit is a red pixel unit; the plurality of second pixel units comprises a plurality of rows of pixel units, every three adjacent second pixel units is a repeating unit, a first one pixel unit in each repeating unit is a red pixel unit, a second one pixel unit in each repeating unit is a green pixel unit, and a third one pixel unit in each repeating unit is a blue pixel unit; the first one pixel unit in the plurality of first pixel units is correspondingly stacked with the first one pixel unit in the plurality of second pixel units; the second one pixel unit in the plurality of first pixel units is correspondingly stacked with the second one pixel unit in the plurality of second pixel units; and the third one pixel unit in the plurality of first pixel units is correspondingly stacked with the third one pixel unit in the plurality of second pixel units.

For example, in the double-sided display panel provided by at least one embodiment of the present disclosure, each first pixel unit comprises a first organic electroluminescent component; each second pixel unit comprises a second organic electroluminescent component; the first organic electroluminescent component comprises a first pixel electrode, a first light-emitting layer, and a cathode which are sequentially stacked on a base substrate; the second organic electroluminescent component comprises a second light-emitting layer and a second pixel electrode which are sequentially stacked on the cathode; and the first organic electroluminescent component and the second organic electroluminescent component share the cathode.

For example, the double-sided display panel provided by at least one embodiment of the present disclosure further comprises a first pixel drive circuit configured to drive the first organic electroluminescent component and a second pixel drive circuit configured to drive the second organic electroluminescent component; the first pixel drive circuit comprises a first drive transistor, and the second pixel drive circuit comprises a second drive transistor; the first drive transistor and the second drive transistor are in a same layer, and are between the first light adjusting component and the base substrate, the first pixel electrode of the first organic electroluminescent component is connected to a source electrode of the first drive transistor, and the second pixel electrode of the second organic electroluminescent component is connected to a source electrode of the second drive transistor.

For example, in the double-sided display panel provided by at least one embodiment of the present disclosure, the cathode is a transparent cathode.

For example, the double-sided display panel provided by at least one embodiment of the present disclosure further comprises a first gate line and a second gate line which are between adjacent two rows of pixel units, the first gate line is configured to provide a gate signal for first pixel units in one row of the adjacent two rows of pixel units, and the second gate line is configured to provide a gate signal for second pixel units in other row of the adjacent two rows of pixel units.

For example, the double-sided display panel provided by at least one embodiment of the present disclosure further comprises a data line between adjacent two columns of pixel units, and the data line is configured to provide a data signal for first pixel units in one column of the adjacent two columns of pixel units and to provide a data signal for second pixel units in other column of the adjacent two columns of pixel units.

For example, the double-sided display panel provided by at least one embodiment of the present disclosure further comprises an encapsulation layer on the second light adjusting component.

For example, the double-sided display panel provided by at least one embodiment of the present disclosure further comprises a pixel defining layer, and an orthographic projection of the first pixel drive circuit on the base substrate and an orthographic projection of the second pixel drive circuit on the base substrate are located within an orthographic projection of the pixel defining layer on the base substrate.

For example, the double-sided display panel provided by at least one embodiment of the present disclosure further comprises a first base substrate and a second base substrate, the first display layer is on the first base substrate, and the first base substrate is configured to allow light emitted by the first display layer to be emitted out from the first base substrate, the second display layer is on the second base substrate, and the first base substrate and the second base substrate are stacked in a first direction, and the second base substrate is configured to allow light emitted by the second display layer to be emitted out from the second base substrate At least one embodiment of the present disclosure provides a double-sided display device, and the double-sided display device comprises the double-sided display panel according to any one of the above embodiments.

At least one embodiment of the present disclosure provides a manufacture method of a double-sided display panel, the manufacture method comprises forming a first display layer and a second display layer which are opposite to each other, forming the first display layer comprises: forming a plurality of first pixel units arranged periodically and a plurality of first light adjusting components which are stacked in one-to-one correspondence with the plurality of first pixel units, in which the plurality of first pixel units are configured to emit first monochromatic light or white light comprising the first monochromatic light, and the plurality of first light adjusting components corresponding to the plurality of first pixel units are configured to transmit only the first monochromatic light or the first monochromatic light in the white light; and forming the second display layer comprises: forming a plurality of second pixel units arranged periodically and a plurality of second light adjusting components which are stacked in one-to-one correspondence with the plurality of second pixel units, in which the plurality of second pixel units are configured to emit second monochromatic light or white light comprising the second monochromatic light, and the plurality of second light adjusting components corresponding to the plurality of second pixel units are configured to transmit only the second monochromatic light or the second monochromatic light in the white light.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
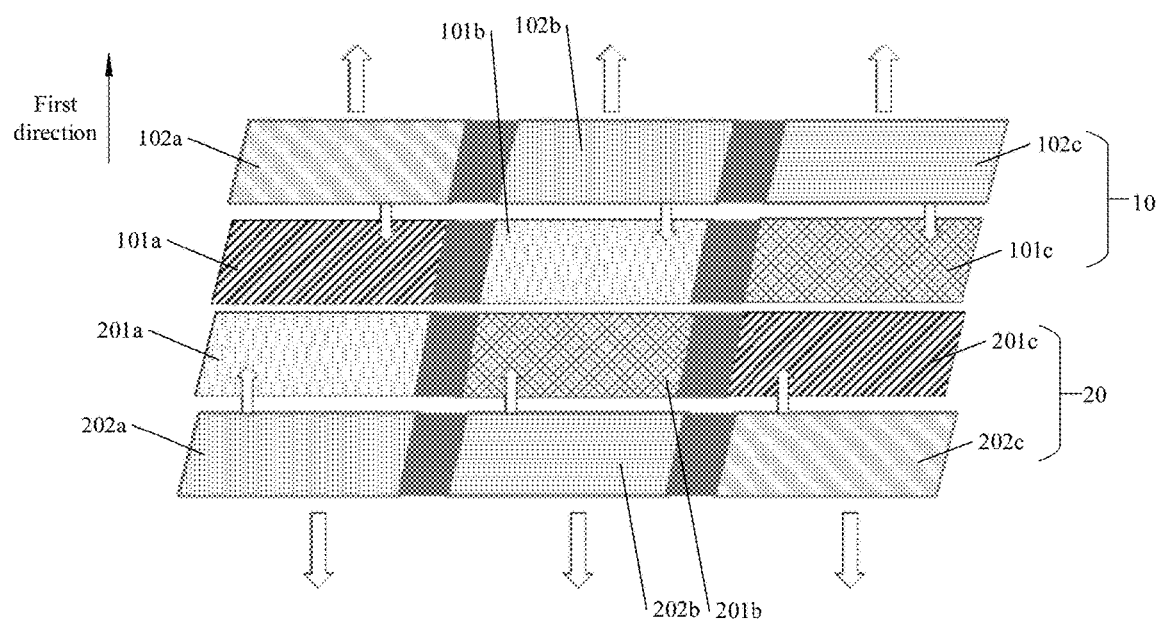
FIG. 1 is a schematic diagram of a corresponding arrangement of pixel units and light adjusting components in a double-sided display panel according to at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In current display technologies, a method of combining two single-sided display devices is usually adopted to achieve double-sided display, this method is not only expensive, but also requires a large space and is not beautiful. Or, in some display devices, a reflective layer on a back side of a display device is removed, so that the back side of the display device can display a mirror display effect of the conventional display, however, in this method, two sides of the display device can only display the same content, and the display effect is not good, which cannot bring good experiences to users.

At least one embodiment of the present disclosure provides a double-sided display panel, which comprises a first display layer and a second display layer which are disposed opposite to each other. The first display layer comprises: a plurality of first pixel units arranged periodically and a plurality of first light adjusting components which are stacked in one-to-one correspondence with the plurality of first pixel units, the plurality of first pixel units are configured to emit first monochromatic light or white light comprising the first monochromatic light, and the plurality of first light adjusting components corresponding to the plurality of first pixel units are configured to transmit only the first monochromatic light or the first monochromatic light in the white light. The second display layer comprises: a plurality of second pixel units arranged periodically and a plurality of second light adjusting components which are stacked in one-to-one correspondence with the plurality of second pixel units, the plurality of second pixel units are configured to emit second monochromatic light or white light comprising the second monochromatic light, and the plurality of second light adjusting components corresponding to the plurality of second pixel units are configured to transmit only the second monochromatic light or the second monochromatic light in the white light.

The double-sided display panel and the manufacture method thereof, and the double-sided display device of the present disclosure will be described below by several specific embodiments.

Figure 2:
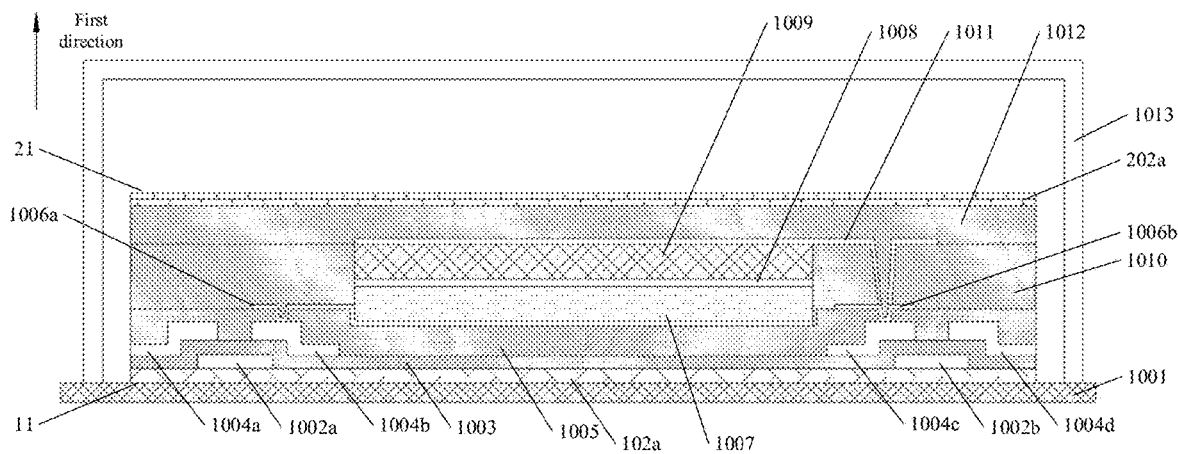
FIG. 2 is a schematic cross-sectional structural diagram of a double-sided display panel according to at least one embodiment of the present disclosure.

At least one embodiment of the present disclosure provides a double-sided display panel, FIG. 1 shows a corresponding relationship between pixel units and light adjusting components in the double-sided display panel, and FIG. 2 shows a partial cross-sectional structure of the double-sided display panel. As shown in FIG. 1 and FIG. 2, the double-sided display panel comprises a first display layer 10 and a second display layer 20 which are disposed opposite to each other. The first display layer 10 comprises a plurality of first pixel units, such as a first pixel unit 101a, a first pixel unit 101b, and a first pixel unit 101c, which are arranged periodically, and comprises a plurality of first light adjusting components, such as a first light adjusting component 102a, a first light adjusting component 102b, and a first light adjusting component 102c, which are stacked in one-to-one correspondence with the plurality of first pixel units in a direction away from the second display layer 20. That is, a light-emitting side of the first pixel unit 101a is provided with the first light adjusting component 102a, a light-emitting side of the first pixel unit 101b is provided with the first light adjusting component 102b, and a light-emitting side of the first pixel unit 101c is provided with the first light adjusting component 102c.

For example, the first pixel unit 101a is configured to emit first monochromatic light or white light comprising the first monochromatic light. The first pixel unit 101b is configured to emit first monochromatic light or white light comprising the first monochromatic light. The first pixel unit 101c is configured to emit first monochromatic light or white light comprising the first monochromatic light.

The first light adjusting component 102a is configured to transmit only the first monochromatic light emitted by the first pixel unit 101a, the first light adjusting component 102b is configured to transmit only the first monochromatic light emitted by the first pixel unit 101b, and the first light adjusting component 102c is configured to transmit only the first monochromatic light emitted by the first pixel unit 101c.

The second display layer 20 comprises a plurality of second pixel units, such as a second pixel unit 201a, a second pixel unit 201b, and a second pixel unit 201c, which are arranged periodically, and comprises a plurality of second light adjusting components, such as a second light adjusting component 202a, a second light adjusting component 202b, and a second light adjusting component 202c, which are stacked in one-to-one correspondence with the plurality of second pixel units in a direction away from the first display layer 10.

For example, the second pixel units are configured to emit second monochromatic light or white light comprising the second monochromatic light. The second light adjusting component 202a is configured to transmit only the second monochromatic light emitted by the second pixel unit 201a, the second light adjusting component 202b is configured to transmit only the second monochromatic light emitted by the second pixel unit 201b, and the second light adjusting component 202c is configured to transmit only the second monochromatic light emitted by the second pixel unit 201c.

In some implementations, colors of the monochromatic light which can be transmitted by the first light adjusting component 102a and the second light adjusting component 202a which are correspondingly stacked are different, colors of the monochromatic light which can be transmitted by the first light adjusting component 102b and the second light adjusting component 202b which are correspondingly stacked are different, and colors of the monochromatic light which can be transmitted by the first light adjusting component 102c and the second light adjusting component 202c which are correspondingly stacked are different.

For example, the first pixel units and the second pixel units may be pixel units that emit white light, may also be pixel units that respectively emit monochromatic light (such as, red light, green light, or blue light), or one kind of the first pixel units and the second pixels unit may emit white light, and the other kind of the first pixel unit and the second pixel unit may emit monochromatic light. If at least one kind of the first pixel units and the second pixel units emits white light, a light adjusting component which allows red light, green light, or blue light to pass through can be disposed on a pixel unit emitting white light. If at least one kind of the first pixel units and the second pixel units emits monochromatic light, a light adjusting component which allows the light emitted by the pixel unit of a corresponding color to pass through can be disposed on the pixel unit that emits monochromatic light.

For example, in an example, the plurality of first pixel units, such as the first pixel unit 101a, the first pixel unit 101b, and the first pixel unit 101c comprised in the first display layer may respectively emit white light, and in this case, the first light adjusting component 102a, the first light adjusting component 102b, the first light adjusting component 102c which are stacked in one-to-one correspondence with the first pixel unit 101a, the first pixel unit 101b, and the first pixel unit 101c are respectively configured to transmit only monochromatic light of one color, for example, the first light adjusting component 102a, the first light adjusting component 102b, the first light adjusting component 102c can respectively transmit red light, green light, and blue light. For example, the plurality of second pixel unit, such as the second pixel unit 201a, the second pixel unit 201b, and the second pixel unit 201c comprised in the second display layer may also respectively emit white light, and in this case, the second light adjusting component 202a, the second light adjusting component 202b, the second light adjusting component 202c which are stacked in one-to-one correspondence with the second pixel unit 201a, the second pixel unit 201b, and the second pixel unit 201c are respectively configured to transmit only monochromatic light of one color, for example, the second light adjusting component 202a can transmit green light, the second light adjusting component 202b can transmit blue light, and the second light adjusting component 202c can transmit red light. Therefore, colors of light which can be transmitted by the first light adjusting component 102a and the second light adjusting component 202a which are correspondingly stacked are different, colors of light which can be transmitted by the first light adjusting component 102b and the second light adjusting component 202b which are correspondingly stacked are different, colors of light which can be transmitted by the first light adjusting component 102c and the second light adjusting component 202c which are correspondingly stacked are different, so that it can be effectively achieved that different display surfaces can display different images.

In the above examples, for example, a reflective electrode is disposed between the first pixel unit 101a and the second pixel unit 201a, a reflective electrode is disposed between the first pixel unit 101b and the second pixel unit 201b, a reflective electrode is disposed between the first pixel unit 101c and the second pixel unit 201c, and the reflective electrodes are configured to be capable of reflecting light. For example, the reflective electrodes are first electrodes 1008 (described later) shared by light-emitting components (such as OLED) of the first pixel units and the second pixel units that are disposed correspondingly, that is, the first electrode 1008 shared by a light-emitting component of the first pixel unit 101a and a light-emitting component of the second pixel unit 201a, the first electrode 1008 shared by a light-emitting component of the first pixel unit 101b and a light-emitting component of the second pixel unit 201b, and the first electrode 1008 shared by a light-emitting component of the first pixel unit 101c and a light-emitting component of the second pixel unit 201c. Therefore, light emitted by the light-emitting component in the first pixel unit 101a is only emitted out from the first light adjusting component 102a, light emitted by the light-emitting component in the first pixel unit 101b is only emitted out from the first light adjusting component 102b, light emitted by the light-emitting component in the first pixel unit 101c is only emitted out from the first light adjusting component 102c, which are only used for the display of the first display layer. Light emitted by the light-emitting component in the second pixel unit 201a is only emitted out from the second light adjusting component 202a, light emitted by the light-emitting component in the second pixel unit 201b is only emitted out from the second light adjusting component 202b, light emitted by the light-emitting component in the second pixel unit 201c is only emitted out from the second light adjusting component 202c, which are only used for the display of the second display layer. Therefore, display crosstalk does not occur between the first display layer and the second display layer.

For example, in another example, combining FIG. 1 and FIG. 2, the double-sided display panel has a first display surface 11 and a second display surface 21 that are parallel to each other, and comprises a first display layer 10 and a second display layer 20 which are stacked in a first direction perpendicular to the first display surface.

For example, the first display layer 10 comprises a first light-emitting layer and a first light adjusting component layer which are stacked in the first direction, and the first light adjusting component layer (that is, the plurality of first light adjusting components) constitutes the first display surface 11. The first light-emitting layer comprises a plurality of first pixel units 101a, 101b, and 101c that emit light of different colors, the plurality of first pixel units are arranged periodically along the first display surface. The first light adjusting component layer comprises a first light adjusting component 102a corresponding to the first pixel unit 101a, a first light adjusting component 102b corresponding to the first pixel unit 101b, and a first light adjusting component 102c corresponding to the first pixel unit 101c. The first light adjusting component 102a is configured to transmit only the monochromatic light emitted by the first pixel unit 101a corresponding to the first light adjusting component 102a, the first light adjusting component 102b is configured to transmit only the monochromatic light emitted by the first pixel unit 101b corresponding to the first light adjusting component 102b, and the first light adjusting component 102c is configured to transmit only the monochromatic light emitted by the first pixel unit 101c corresponding to the first light adjusting component 102c. For example, colors of monochromatic light emitted by the plurality of first pixel units 101a, 101b, and 101c are different.

For example, the second display layer 20 comprises a second light-emitting layer and a second light adjusting component layer which are stacked in the first direction, and the second light adjusting component layer (that is, the plurality of light adjusting components) constitutes the second display surface 21. The second light-emitting layer comprises a plurality of second pixel units 201a, 201b, and 201c that emit light of different colors, the plurality of second pixel units 201a, 201b, and 201c are arranged periodically along the second display surface. The second pixel unit 201a and the first pixel unit 101a are disposed in a stacked manner, and a color of the monochromatic light emitted by the second pixel unit 201a and a color of the monochromatic light emitted by the first pixel unit 101a are different. The second pixel unit 201b and the first pixel unit 101b are disposed in a stacked manner, and a color of the monochromatic light emitted by the second pixel unit 201b and a color of the monochromatic light emitted by the first pixel unit 101b are different. The second pixel unit 201c and the first pixel unit 101c are disposed in a stacked manner, a color of the monochromatic light emitted by the second pixel unit 201c and a color of the monochromatic light emitted by the first pixel unit 101c are different. The second light adjusting component layer comprises a second light adjusting component 202a corresponding to the second pixel unit 201a, a second light adjusting component 202b corresponding to the second pixel unit 201b, and a second light adjusting component 202c corresponding to the second pixel unit 201c. The second light adjusting component 202a is configured to transmit only the monochromatic light emitted by the second pixel unit 201a corresponding to the second light adjusting component 202a, the second light adjusting component 202b is configured to transmit only the monochromatic light emitted by the second pixel unit 201b corresponding to the second light adjusting component 202b, and the second light adjusting component 202c is configured to transmit only the monochromatic light emitted by the second pixel unit 201c corresponding to the second light adjusting component 202c. For example, colors of monochromatic light emitted by the plurality of second pixel units 201a, 201b, and 201c are different.

It should be noted that, "disposed in a stacked manner" indicates that orthographic projections of two or more functional layers on a plane where the two or more functional layers are disposed have an overlapping portion, in other words, in a case where two or more functional layers are stacked in the first direction, the orthographic projections of the two or more functional layers have an overlapping portion on a plane perpendicular to the first direction. For example, in the embodiment, orthographic projections of the first pixel unit and the second pixel unit which are disposed in a stacked manner on the first display surface have an overlapping portion.

For example, the plurality of first pixel units comprised in the first display layer comprise a plurality of first red pixel units, a plurality of first green pixel units, and a plurality of first blue pixel units, the plurality of first red pixel units, the plurality of first green pixel units, and the plurality of first blue pixel units are arranged in an array, and colors of two adjacent first pixel units are different; and the plurality of second pixel units of the second display layer comprise a plurality of second red pixel units, a plurality of second green pixel units, and a plurality of second blue pixel units, the plurality of second red pixel units, the plurality of second green pixel units, and the plurality of second blue pixel units are arranged in an array, and colors of two adjacent second pixel units are different.

For example, the plurality of first pixel units comprises a plurality of rows of pixel units, every three adjacent first pixel units is a repeating unit, a first one pixel unit in each repeating unit is a green pixel unit, a second one pixel unit in each repeating unit is a blue pixel unit, and a third one pixel unit in each repeating unit is a red pixel unit. The plurality of second pixel units comprises a plurality of rows of pixel units, every three adjacent second pixel units is a repeating unit, a first one pixel unit in each repeating unit is a red pixel unit, a second one pixel unit in each repeating unit is a green pixel unit, and a third one pixel unit in each repeating unit is a blue pixel unit. The first one pixel unit in the plurality of first pixel units and the first one pixel unit in the plurality of second pixel units are correspondingly disposed in a stacked manner; the second one pixel unit in the plurality of first pixel units and the second one pixel unit in the plurality of second pixel units are correspondingly disposed in a stacked manner; and the third one pixel unit in the plurality of first pixel units and the third one pixel unit in the plurality of second pixel units are correspondingly disposed in a stacked manner.

For example, in an example of the embodiment, the plurality of first pixel units comprise a first red pixel unit 101a, a first green pixel unit 101b, and a first blue pixel unit 101c; for example, colors of two adjacent first pixel units are different. For example, the first red pixel unit 101a, the first green pixel unit 101b, and the first blue pixel unit 101c may constitute a first pixel of the first display layer 10, so that the first display layer 10 has a plurality of first pixels arranged in an array. The plurality of second pixel units comprise a second red pixel unit 201c, a second green pixel unit 201a, and a second blue pixel unit 201b, for example, colors of two adjacent second pixel units are different. For example, the second red pixel unit 201c, the second green pixel unit 201a, and the second blue pixel unit 201b may constitute a second pixel of the second display layer 20, so that the second display layer 20 has a plurality of second pixels arranged in an array. The first red pixel unit 101a and the second green pixel unit 201a (the case shown in FIG. 1) or the second blue pixel unit 201b are correspondingly disposed in a stacked manner, the first green pixel unit 101b and the second red pixel unit 201a or the second blue pixel unit 202b (the case shown in FIG. 1) are correspondingly disposed in a stacked manner, and the first blue pixel unit 101c and the second red pixel unit 201c (the case shown in FIG. 1) or the second green pixel unit 201a are correspondingly disposed in a stacked manner.

In this example, the plurality of first light adjusting components comprise a first red light adjusting component 102a corresponding to the first red pixel unit 101a, a first green light adjusting component 102b corresponding to the first green pixel unit 101b, and a first blue light adjusting component 102c corresponding to the first blue pixel unit 101c. The first red light adjusting component 102a can transmit only red light emitted by the first red pixel unit 101a, the first green light adjusting component 102b can transmit only green light emitted by the first green pixel unit 101b, and the first blue light adjusting component 102c can transmit only blue light emitted by the first blue pixel unit 101c. The plurality of second light adjusting components comprise a second red light adjusting component 202c, a second green light adjusting component 202a, and a second blue light adjusting component 202b which respectively correspond to the second red pixel unit 201c, the second green pixel unit 201a, and the second blue pixel unit 201b. The second red light adjusting component 202c can transmit only red light emitted by the second red pixel unit 201c, the second green light adjusting component 202a can transmit only green light emitted by the second green pixel unit 201a, and the second blue light adjusting component 202b can transmit only blue light emitted by the second blue pixel unit 201b.

In this embodiment, the plurality of first light adjusting components in the first light adjusting component layer can filter light emitted by the plurality of first pixel units in the first light-emitting layer, respectively, and the plurality of second light adjusting components in the second light adjusting component layer can filter light emitted by the plurality of second pixel units in the second light-emitting layer, respectively, so that the light emitted by the first pixel unit and the light emitted by the second pixel unit which is stacked with the first pixel unit do not affected each other. That is, the light emitted by the plurality of first pixel units in the first light-emitting layer is emitted out only from the first display surface, and the light emitted by the plurality of second pixel units in the second light-emitting layer is emitted out only from the second display surface, so that the double-sided display panel can achieve a double-sided display effect.

In this embodiment, of course, the first pixel units and the second pixel units may also be configured to emit light of other colors, such as, white, magenta, cyan, or yellow; correspondingly, the first light adjusting components corresponding to the first pixel units or the second light adjusting components corresponding to the second pixel units should also be configured to transmit only light of a corresponding color. The embodiment does not specifically limit this.

For example, in at least one example of this embodiment, the first light adjusting component may also be configured to reflect light of other colors except the light emitted by the first pixel unit corresponding to the first light adjusting component; and the second light adjusting component may also be configured to reflect light of other colors except the light emitted by the second pixel unit corresponding to the second light adjusting component.

For example, a transparent electrode (for example, a transparent cathode) is, for example, disposed between the first pixel unit and the second pixel unit, and the transparent electrode can transmit light. For example, the transparent electrode is a first electrode 1008 (described later) shared by light-emitting components (such as OLED) of the first pixel unit and the second pixel unit, for example, the first electrode is a cathode. Therefore, the utilization rate of light emitted by the light-emitting components in the first pixel unit and the second pixel unit can be improved, thereby improving display brightness and saving energy consumption.

For example, in an example, in a case where the plurality of first pixel units comprise the first red pixel unit 101a, the first green pixel unit 101b, and the first blue pixel unit 101c, and the plurality of second pixel units comprise the second red pixel unit 201c, the second green pixel unit 201a, and the second blue pixel unit 201b, the first red light adjusting component 102a and the second red light adjusting component 202c can also reflect light of other colors, such as green light and blue light, except the red light; the first green light adjusting component 102b and the second green light adjusting component 202a can also reflect light of other colors, such as red light and blue light, except the green light; the first blue light adjusting component 102c and the second blue light adjusting component 202b can also reflect light of other colors, such as red light and green light, except the blue light.

In this example, for example, in a case shown in FIG. 1, in a case where the first red light adjusting component 102a transmits the red light emitted by the first red pixel unit 101a, the first red light adjusting component 102a can also reflect the green light emitted by the second green pixel unit 201a corresponding to the first red light adjusting component 102a, so that the green light emitted by the second green pixel unit 201a can be reflected and transmitted through the second green light adjusting component 202a, furthermore, the green light can be emitted out from the second display surface, thereby enhancing the display brightness of the second display surface and improving the display effect of the second display surface. Similarly, in a case where the second green light adjusting component 202a transmits the green light emitted by the second green pixel unit 201a, the second green light adjusting component 202a can also reflect the red light emitted by the first red pixel unit 101a corresponding to the second green light adjusting component 202a, so that the red light emitted by the first red pixel unit 101a can be reflected and transmitted through the first red pixel unit 101a, furthermore, the red light can be emitted out from the first display surface, thereby enhancing the display brightness of the first display surface and improving the display effect of the first display surface. In this embodiment, working principles of the other light adjusting components are the same as the above described working principle, and details are not described herein again.

In this example, the first light adjusting component and/or the second light adjusting component may further have a function of reflecting light of other colors except the light emitted by the first pixel unit or the second pixel unit corresponding thereto, so that the double-sided display brightness of the double-sided display panel can be enhanced, thereby improving the double-sided display effect of the double-sided display panel and reducing the power consumption of the double-sided display panel.

For example, in this embodiment, the first light adjusting component may be various types of light adjusting components such as a photonic crystal, a grating light valve, a color filter, or the like, the second light adjusting component may be various types of light adjusting components such as a photonic crystal, a grating light valve, a color filter, or the like, as long as the first light adjusting component or the second light adjusting component can achieve the technical effect of transmitting only the light of a color emitted by the pixel unit corresponding thereto.

Figure 3:
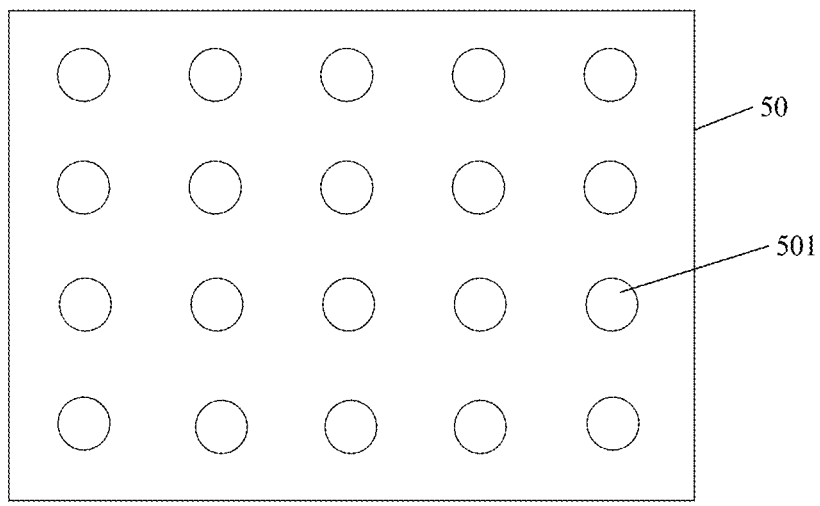
FIG. 3 is a schematic plane structural diagram of a photonic crystal according to at least one embodiment of the present disclosure.

For example, as shown in FIG. 3, the photonic crystal which is used as a light adjusting component comprises a first matrix 50 and a plurality of columnar structures 501 periodically disposed in the first matrix 50, and a refractive index of the first matrix 50 is different from refractive indexes of the plurality of columnar structures 501.

For example, the first matrix 50 may be made of a non-metal material such as silicon nitride or silicon oxide, and the columnar structures 501 may be structures such as air holes which are periodically formed in the first matrix 50.

For example, a color type of light that a photonic crystal can transmit can be adjusted by designing a material of the first matrix 50, structure parameters of the columnar structures 501, and the like. For example, the structure parameters may comprise a diameter of a columnar structure 501, a distance between the columnar structures 501, a duty ratio (a ratio of the diameter of the columnar structure 501 to the distance between the columnar structures 501), a depth of the columnar structure 501, and the like. By adjusting the above parameters of the photonic crystals, it can be achieved that the photonic crystals respectively adjust the light of different colors. For example, a photonic crystal can transmit only light of a certain color, and for example, the photonic crystal can also reflect light of other colors while transmitting only light of a certain color.

Figure 4A:
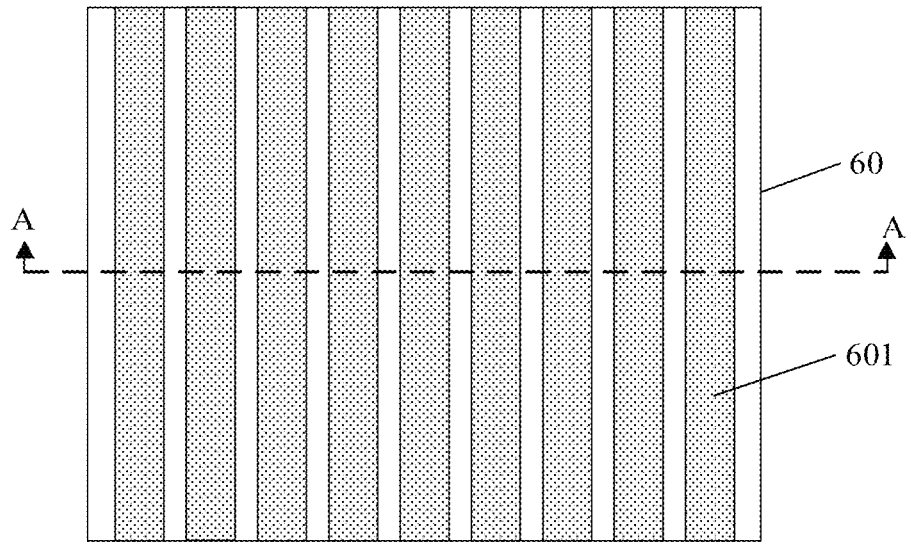
FIG. 4a is a schematic plane structural diagram of a grating light valve according to at least one embodiment of the present disclosure.
Figure 4B:
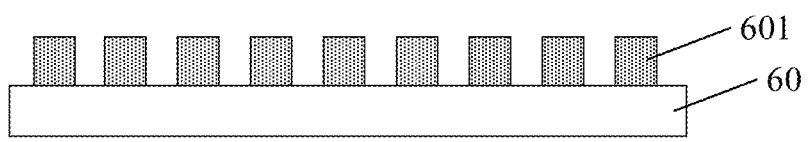
FIG. 4b is a schematic cross-sectional structural diagram of the grating light valve in FIG. 4a taken along line A-A.

For example, FIG. 4a is a schematic plane structural diagram of a grating light valve according to the embodiment, and FIG. 4b is a schematic cross-sectional structural diagram of the grating light valve in FIG. 4a taken along line A-A. For example, as shown in FIG. 4a and FIG. 4b, a grating light valve which is used as a light adjusting component comprises a second matrix 60 and strip protrusion structures 601 arranged in parallel on the second matrix 60.

For example, the second matrix 60 may be a glass substrate, the strip protrusion structures 601 may be strip protrusion structures formed by a photolithography process or the like on the second matrix 60, for example, the strip protrusion structures 601 may be made of a metal material such as aluminum, chromium, silver, gold, or copper.

For example, a color type of light that a grating light valve can transmit can be adjusted by designing a material of the second matrix 60, structure parameters of the strip protrusion structures 601, and the like. For example, the structure parameters can comprise widths and heights of the strip protrusion structures 601, a distance between adjacent strip protrusion structures 601, and the like. By adjusting the above parameters of the grating light valves, it can be achieved that the grating light valves respectively adjust the light of different colors. For example, a grating light valve can transmit only light of a certain color.

For example, in this embodiment, a color filter which is used as a light adjusting component is an optical filter that expresses color, and can precisely select light in a small range of wavelengths that expects to be transmitted, and absorb or reflect other light that does not expect to be transmitted. The color filter generally comprises a glass substrate, a black matrix, a color layer, a protective layer, and the like. For example, a color type of light that the color filter can transmit can be selected by changing a color of the color layer in the color filter.

For example, in this embodiment, the first pixel unit comprises a first organic electroluminescent component (such as, an organic light-emitting diode OLED) and a first pixel drive circuit configured to drive the first organic electroluminescent component; and the second pixel unit comprises a second organic electroluminescent component and a second pixel drive circuit configured to drive the second organic electroluminescent component.

For example, in this embodiment, the plurality of first pixel units are stacked in one-to-one correspondence with the plurality of second pixel units, a plane shape and a plane size of a light-emitting layer of a light-emitting diode (OLED) of the first pixel unit are respectively substantially same as a plane shape and a plane size of a light-emitting layer of a light-emitting diode (OLED) of the second pixel unit which is correspondingly stacked with the first pixel unit; a plane size of the first light adjusting component is larger than a plane size of a light-emitting layer of an organic light-emitting diode (OLED) in the first pixel unit which is disposed in a stacked manner with the first light adjusting component, and a plane size of the second light adjusting component is larger than a plane size of a light-emitting layer of an organic light-emitting diode (OLED) in the second pixel unit which is disposed in a stacked manner with the second light adjusting component. Therefore, the first light adjusting component and the second light adjusting component can perform a more sufficient adjusting effect on the light emitted by the OLEDs.

It should be noted that, the plane shape and the plane size in the above embodiments respectively refer to a shape (such as, rectangle, square, and the like) and a size (such as, an area occupied in the plane schematic diagram) of the light-emitting layer or the light adjusting component which can be seen in the plane schematic diagram of the display substrate.

For example, as shown in FIG. 2, the first organic electroluminescent component comprised in the first pixel unit comprises a first electrode 1008 (such as, a cathode), a second electrode 1006a (such as, a pixel electrode), and a first organic light-emitting layer 1007 between the first electrode 1008 and the second electrode 1006a, in a case where an appropriate voltage is applied between the first electrode 1008 and the second electrode 1006a, the first organic light-emitting layer 1007 can emit light. For example, the first pixel drive circuit that drives the first organic electroluminescent component comprises a first thin film transistor, and the first thin film transistor comprises, for example, a first gate electrode 1002a, an active layer 1003, a first source electrode 1004, a first drain electrode 1004b, and the like. For example, the first drain electrode 1004b of the first thin film transistor is electrically connected to the second electrode 1006a of the first organic electroluminescent component, thereby achieving driving control of the first organic electroluminescent component. According to the design, the first pixel drive circuit may further comprise more thin film transistors, capacitors, and the like, to constitute, for example, a pixel drive circuit in a form of 2T1C (that is, two thin film transistors and a capacitor), 4T2C, or the like. The first organic electroluminescent component may further comprise organic function layers such as an electron injection layer, an electron transport layer, a hole transport layer, a hole injection layer, or the like.

For example, referring to FIG. 2, the second organic electroluminescent component comprised in the second pixel unit comprises the first electrode 1008 (such as, a cathode), a third electrode 1011 (such as, a pixel electrode), and a second organic light-emitting layer 1009 between the first electrode 1008 and the third electrode 1011, in a case where an appropriate voltage is applied between the first electrode 1008 and the third electrode 1011, the second organic light-emitting layer 1009 can emit light. For example, the second pixel drive circuit that drives the second organic electroluminescent component comprises a second thin film transistor, and the second thin film transistor comprises, for example, a second gate electrode 1002*b*, an active layer 1003, a second source electrode 1004*c*, a second drain electrode 1004*d*, and the like. For example, the second source electrode 1004*c* of the second thin film transistor is electrically connected to the third electrode 1011 of the second organic electroluminescent component, thereby achieving driving control of the second organic electroluminescent component. Similarly, according to the design, the second pixel drive circuit may further comprise more thin film transistors, capacitors, and the like, to constitute, for example, a pixel drive circuit in a form of 2T1C, 4T2C, or the like. The second organic electroluminescent component may further comprise organic function layers such as an electron injection layer, an electron transport layer, a hole transport layer, a hole injection layer, or the like.

In this example, the first thin film transistor that drives the first organic electroluminescent component and the second thin film transistor that drives the second organic electroluminescent component are disposed in the same layer, this design can save space and further facilitate the thin design of the double-sided display panel; in addition, this design is also advantageous for simplifying the manufacture process of the double-sided display panel, for example, the first thin film transistor and the second thin film transistor can be formed in the same manufacture process (including a patterning process, and the like), thereby simplifying the production process.

Figure 5:
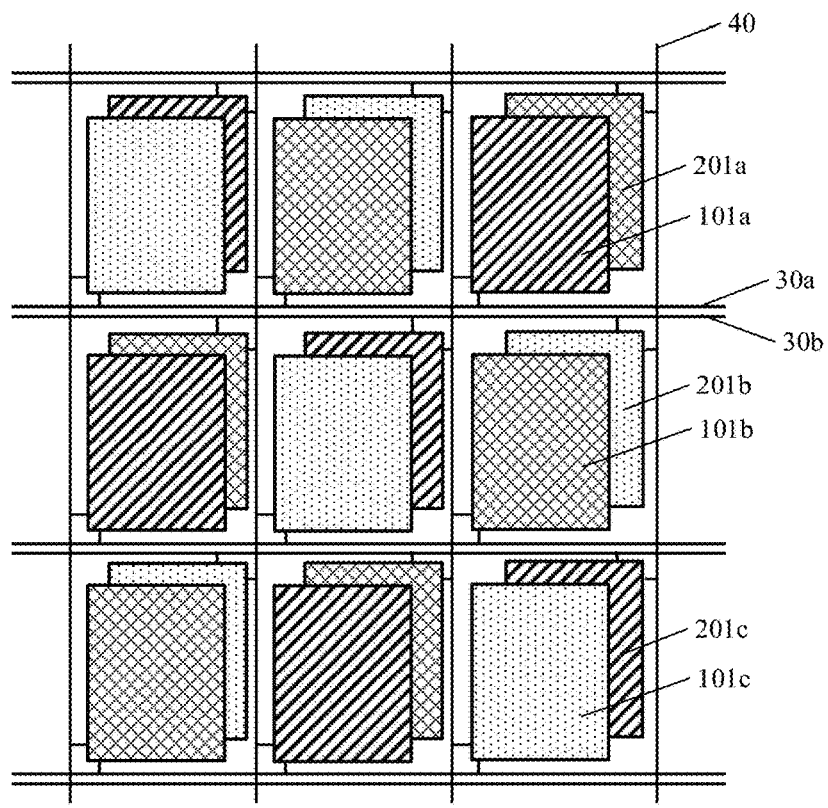
FIG. 5 is a schematic plane structural diagram of a double-sided display panel according to at least one embodiment of the present disclosure.

For example, in this example, the first organic electroluminescent component of the first pixel unit and the second organic electroluminescent component of the second pixel unit which is stacked with the first pixel unit share one first electrode 1008, and this design can save the material and disposing space of one electrode, thereby facilitating the thin design of the double-sided display panel. For example, the first electrode 1008 may be used to provide a common voltage. For example, the first electrode 1008 can be connected to a power source through a common power line (not shown). For example, in this embodiment, as shown in FIG. 5, the double-sided display panel may also comprise a plurality of first gate lines 30*a* and a plurality of second gate lines 30*b*. The plurality of first gate lines 30*a* are used to drive the plurality of rows of first pixel units, respectively, and the plurality of second gate lines 30*b* are used to drive the plurality of rows of second pixel units, respectively. For example, the first gate line 30*a* is electrically connected to the first pixel drive circuit, for example, is electrically connected to the first gate electrode 1002*a* of the first thin film transistor; and the second gate line 30*b* is electrically connected to the second pixel drive circuit, for example, is electrically connected to the second gate electrode 1002*b* of the second thin film transistor.

For example, as shown in FIG. 5, a first gate line 30*a* for driving first pixel units in one row (an upper row in the drawing) of two adjacent rows and a second gate line 30*b* for driving second pixel units in the other row (a lower row in the drawing) of the two adjacent rows may be disposed between the two adjacent rows of first pixel units and the second pixel units which are stacked with each other; that is, a first gate line and a second gate line are disposed between adjacent two rows of pixel units, the first gate line is used for providing a gate signal for the first pixel units of one row of the adjacent two rows of pixel units, and the second gate line is used for providing a gate signal for the second pixel units of the other row of the adjacent two rows of pixel units. Alternatively, in other examples of the embodiment, the first gate line 30*a* may also be located between two adjacent rows of first pixel units, and the second gate line 30*b* may also be located between two adjacent rows of second pixel units, so that it is beneficial to a case that the first gate line 30*a* and the second gate line 30*b* are respectively electrically connected to the first pixel drive unit of the first pixel unit and the second pixel drive unit of the second pixel unit, thereby achieving the driving control of the first pixel unit and the second pixel unit.

For example, as shown in FIG. 5, the double-sided display panel may also comprise data lines 40 which intersect the first gate lines 30*a* and the second gate lines 30*b*, the first gate lines 30*a*, the second gate lines 30*b*, and the data lines 40 together define regions in which the first pixel units and the second pixel units are disposed. For example, each data line 40 is disposed between adjacent two columns of pixel units, and the data line 40 is configured to provide a data signal for first pixel units in one column of the adjacent two columns of pixel units and to provide a data signal for second pixel units in the other column of the adjacent two columns of pixel units. For example, the data line 40 may also be electrically connected to the first pixel drive circuit of the first pixel unit and the second pixel drive circuit of the second pixel unit, respectively, for example, be electrically connected to the first source electrode 1004*a* of the first thin film transistor and the second drain electrode 1004*d* of the second thin film transistor, respectively, thereby implementing driving control of the first pixel unit and the second pixel unit together with the first gate line 30*a* and the second gate line 30*b*.

For example, in this embodiment, as shown in FIG. 2, the double-sided display panel also comprises a base substrate 1001, the first display layer and the second display layer are sequentially stacked on the same side of the base substrate 1001. For example, the first light adjusting component, the first pixel unit, the second pixel unit, and the second light adjusting component are sequentially stacked on the base substrate 1001.

For example, the double-sided display panel also comprises a pixel defining layer 1010 having a plurality of openings (only an opening is shown in the drawing) disposed on the base substrate 1001, and therefore the first organic electroluminescent component of the first pixel unit in the first display layer and the second organic electroluminescent component of the second pixel unit in the second display layer may be stacked in the same opening of the pixel defining layer 1010. For example, an orthographic projection of the first pixel drive circuit for the first pixel unit on the base substrate 1001 and an orthographic projection of the second pixel drive circuit for the second pixel unit on the base substrate 1001 are located within an orthographic projection of the pixel defining layer 1010 on the base substrate 1001. Thereby, the pixel drive circuit and the light-emitting component are disposed in a misaligning manner, the pixel drive circuit does not affect a light-emitting effect of the light-emitting component in the opening of the pixel defining layer 1010, and the pixel drive circuit is also not interfered by the light emitted by the light-emitting component.

For example, in this example, as shown in FIG. 2, the first light adjusting component 102a may be directly disposed on the base substrate 1001 to constitute the first display surface, and the second light adjusting component 202a may be directly disposed on a side of the second display layer away from the base substrate 1001 to constitute the second display surface.

For example, in this embodiment, the double-sided display panel may also comprise, for example, a first insulation layer 1005, a second insulation layer 1012, a connection electrode 1006b, an encapsulation layer 1013, and other structures. For example, the first insulation layer 1005 can planarize the functional layers and can insulate and protect the structures such as the drive circuit, or the like. The second insulation layer 1012 may insulate and protect the third electrode 1011, and further achieve planarization of the functional layers to facilitate the subsequent setting of the second light adjusting component 202a. The connection electrode 1006b is disposed in the same layer as the second electrode 1006a, and the connection electrode 1006b is beneficial to achieve the electrical connection between the source electrode 1004c of the second thin film transistor and the third electrode 1011, thereby preventing a phenomenon of occurring poor connection or the like. The encapsulation layer 1013 is disposed on the second light adjusting component, and is configured to protect the overall structure of the double-sided display panel and prevent impurities such as moisture, dust, and the like, in the external environment from entering the inside of the device. In this embodiment, the double-side display panel may further comprise other functional structures, and this embodiment is not limited thereto.

Figure 6:
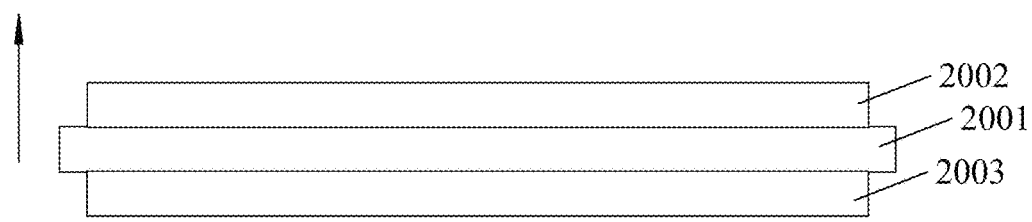
FIG. 6 is a schematic cross-sectional structural diagram of another double-sided display panel according to at least one embodiment of the present disclosure.

For example, in other examples of this embodiment, the first display layer and the second display layer may also be disposed on different sides of the base substrate, respectively. For example, as shown in FIG. 6, the first display layer 2002 is disposed on one side of the base substrate 2001, and a second display layer 2003 is disposed on the other side of the base substrate 2001, so that the first display layer 2002 and the second display layer 2003 can respectively perform display operations on both sides of the base substrate 2001.

Figure 7:
FIG. 7 is a schematic cross-sectional structural diagram of still another double-sided display panel according to at least one embodiment of the present disclosure.

For example, in other examples of this embodiment, as shown in FIG. 7, the double-sided display panel may comprise a first base substrate 3001 and a second base substrate 3002, the first display layer 3003 and the second display layer 3004 are respectively disposed on the first base substrate 3001 and the second base substrate 3002, the first base substrate 3001 and the second base substrate 3002 are stacked in the first direction, so that the first display layer 3003 and the second display layer 3004 are opposite to each other, and the first pixel unit and the second pixel unit disposed opposite to each other respectively in the first display layer 3003 and the second display layer 3004 can emit light of different colors, so that the light emitted by the first pixel unit can only be emitted out from the first display surface 3005 under the action of the first light adjusting component, and the light emitted by the second pixel unit can only be emitted out from the second display surface 3006 under the action of the second light adjusting component, that is, the light emitted by the first pixel unit and the light emitted by the second pixel unit are respectively emitted out from the first base substrate 3001 and the second base substrate 3002, and do not interfere with each other.

In the double-sided display panel provided by at least one embodiment of the present disclosure, the first light adjusting component in the first light adjusting component layer can transmit only light of a specific color emitted by the first pixel unit, which corresponds to the first light adjusting component, in the first light-emitting layer, and the second light adjusting component in the second light adjusting component layer can transmit only light of a specific color emitted by the second pixel unit, which corresponds to the second light adjusting component, in the second light-emitting layer, so that the first light-emitting layer and the second light-emitting layer can display independently, thereby achieving a double-sided display effect. In at least one embodiment, the first light adjusting component and the second light adjusting component can also block or reflect light of other colors, thereby preventing a problem of color crosstalk between different pixel units; meanwhile, a distance between the pixel units can be reduced, thereby increasing the pixel aperture ratio, and furthermore improving the display effect of the double-sided display panel.

It should be noted that, in the embodiments of the present disclosure, in a case where the plurality of first pixel units in the first light-emitting layer are configured to emit white light, and the plurality of second pixel units in the second light-emitting layer may also be configured to emit colored light of different colors; alternatively, in a case where the plurality of first pixel units in the first light-emitting layer are configured to emit colored light of different colors, and the plurality of second pixel units in the second light-emitting layer may also be configured to emit white light, and the embodiments of the present disclosure are not specifically limited in this aspect.

At least one embodiment of the present disclosure also provides a double-sided display device, and the double-sided display device comprises any one of the above double-sided display panels. The double-sided display device may be, for example, an electronic device having a display function such as a television or a computer. The double-sided display device also has the above technical effects, and details are not described herein again.

At least one embodiment of the present disclosure also provides a manufacture method of a double-sided display panel, and the manufacture method comprises forming a first display layer and a second display layer which are opposite to each other. Forming the first display layer comprises: forming a plurality of first pixel units arranged periodically and a plurality of first light adjusting components which are stacked in one-to-one correspondence with the plurality of first pixel units, the first pixel units are configured to emit first monochromatic light or white light comprising the first monochromatic light, and the first light adjusting components corresponding to the first pixel units are configured to transmit only the first monochromatic light or the first monochromatic light in the white light; and forming the second display layer comprises: forming a plurality of second pixel units arranged periodically and a plurality of second light adjusting components which are stacked in one-to-one correspondence with the plurality of second pixel units, the second pixel units are configured to emit second monochromatic light or white light comprising the second monochromatic light, and the second light adjusting components corresponding to the second pixel units are configured to transmit only the second monochromatic light or the second monochromatic light in the white light.

For example, in an embodiment, the manufacture method comprises: forming a first display layer and a second display layer which are disposed opposite to each other. Forming the first display layer comprises: forming a plurality of first pixel units arranged periodically and forming a plurality of first light adjusting components, which are stacked in oneto-one correspondence with the plurality of first pixel units, in a direction away from the second display layer; the plurality of first light adjusting components are respectively formed to transmit only light emitted by the first pixel units and transmit only light of one color. Forming the second display layer comprises: forming a plurality of second pixel units arranged periodically and forming a plurality of second light adjusting components, which are stacked in one-to-one correspondence with the plurality of second pixel units, in a direction away from the first display layer; the plurality of second light adjusting components are respectively formed to transmit only light emitted by the second pixel units and transmit only light of one color. Moreover, the colors of the light that can be transmitted by the first light adjusting component and the second light adjusting component which are correspondingly formed in a stacked manner are different.

For example, in an example, the first display layer and the second display layer are formed in a stacked manner in the first direction. Forming the first display layer comprises: forming a first light-emitting layer and a first light adjusting component layer in a stacked manner in the first direction; the first light adjusting component layer is formed as a first display surface of the double-sided display panel, and the first direction is perpendicular to the first display surface. A plurality of first pixel units emitting light of different colors are formed in the first light-emitting layer, and the plurality of first pixel units are formed periodically along the first display surface. A plurality of first light adjusting components which are in one-to-one correspondence with the plurality of first pixel units are formed in the first light adjusting component layer, each first light adjusting component is formed to transmit only light of a color emitted by a first pixel unit corresponding thereto. Forming the second display layer comprises: forming a second light-emitting layer and a second light adjusting component layer in a stacked manner in the first direction; the second light adjusting component layer is formed as a second display surface of the double-sided display panel. A plurality of second pixel units emitting light of different colors are formed in the second light-emitting layer, and the plurality of second pixel units are formed periodically along the second display surface and are respectively stacked with the plurality of first pixel units; a color of light emitted by the second pixel unit and a color of light emitted by the first pixel unit which is formed corresponding to the second pixel unit are different. A plurality of second light adjusting components which are in one-to-one correspondence with the plurality of second pixel units are formed in the second light adjusting component layer, each second light adjusting component is formed to transmit only light of a color emitted by a second pixel unit corresponding thereto.

For example, in some embodiments of the present disclosure, the manufacture method further comprises providing a base substrate, and the first display layer and the second display layer are sequentially formed on the same side of the base substrate or respectively formed on different sides of the base substrate.

Hereinafter, the manufacture method provided by some embodiments of the present disclosure are described by taking a case that the first display layer and the second display layer are sequentially formed on the same side of the base substrate as an example and in conjunction with the accompanying drawings.

Figure 8A:
FIGS. 8a-8l are schematic cross-sectional structural diagrams of a double-sided display panel during a manufacture process according to at least one embodiment of the present disclosure.

As shown in FIG. 8a, first, a first light adjusting component 102a is formed on the base substrate 1001. The first light adjusting component 102a can be used to form a first display surface of the double-sided display panel. For example, the first light adjusting component 102a can transmit only light of one color, such as red light, green light, or blue light, as needed. For example, the base substrate 1001 is a transparent substrate, for example, may be a glass substrate or the like. For example, the first light adjusting component 102a may be various types of light adjusting components such as a photonic crystal, a grating light valve, or a color filter. For example, in some examples, the first light adjusting component may be, for example, attached to the base substrate 1001 after the first light adjusting component is formed.

For example, in a case where the light adjusting component is the photonic crystal, a preparation process of the photonic crystal may comprise forming a plurality of columnar structures periodically in a first matrix, in which a refractive index of the first matrix is different from refractive indexes of the plurality of columnar structures 501. For example, in an example, the first matrix may be made of a non-metal material such as silicon nitride or silicon oxide, and the columnar structures may be structures such as air holes or the like, for example, the air holes may be periodically formed in the first matrix 50 by a process such as etching. For example, a color type of light that aphotonic crystal can transmit can be adjusted by designing a material of the first matrix, structure parameters of the columnar structures, and the like. For example, the structure parameters may comprise a diameter of a columnar structure, a distance between the columnar structures, a duty ratio, a depth of the columnar structure, and the like. By adjusting the above parameters of the photonic crystals, it can be achieved that the photonic crystals respectively adjust the light of different colors. For example, a photonic crystal can transmit only light of a certain color, and for example, the photonic crystal can also reflect light of other colors while transmitting only light of a certain color.

For example, in a case where the light adjusting component is a grating light valve, a preparation process of the grating light valve may comprise: forming strip protrusion structures arranged in parallel on a second matrix. For example, the second matrix may be a glass substrate, for example, the strip protrusion structures arranged in parallel may be formed by a photolithography process or the like on the second matrix, and for example, the strip protrusion structures may be made of a metal material such as aluminum, chromium, silver, gold, or copper. For example, a color type of light that a grating light valve can transmit can be adjusted by designing a material of the second matrix, structure parameters of the strip protrusion structures, and the like. For example, the structure parameters can comprise widths and heights of the strip protrusion structures, a distance between adjacent strip protrusion structures, and the like. By adjusting the above parameters of the grating light valves, it can be achieved that the grating light valves respectively adjust the light of different colors, for example, a grating light valve can transmit only light of a certain color.

For example, in a case where the light adjusting component is a color filter, the formation of the color filter generally comprises forming a color layer, a black matrix, a protective layer, and the like on a glass substrate. For example, a color type of light that the color filter can transmit can be selected by changing a color of the color layer in the color filter.

The embodiments of the present disclosure do not limit the type of the light adjusting component, as long as the light adjusting component can achieve the technical effect of transmitting only the light of a color emitted by the pixel unit corresponding thereto.

Figure 8B:

As shown in FIG. 8b, after the first light adjusting component 102a is formed, a first gate electrode 1002a and a second gate electrode 1002b may be formed. For example, a method of forming the first gate electrode 1002a and the second gate electrode 1002b may comprise form a gate electrode thin film, and the performing a patterning process on the gate electrode thin film to form the first gate electrode 1002a and the second gate electrode 1002b. For example, the patterning process may comprise processes of photoresist coating, exposure, development, etching, and the like.

For example, while the first gate electrode 1002a and the second gate electrode 1002b are formed, a first gate line 30a and a second gate line 30b (referring to FIG. 5) respectively electrically connected to the first gate electrode 1002a and the second gate electrode 1002b may also be formed simultaneously, and the first gate line 30a and the second gate line 30b are respectively used to transmit driving signals for the first gate electrode 1002a and the second gate electrode 1002b.

For example, a material of the gate electrode thin film may comprise one or more of a group consisting of titanium, tantalum, chromium, aluminum, aluminum alloy, copper, copper alloy, molybdenum, and molybdenum aluminum alloy. For example, each of the first gate electrode 1002a, the second gate electrode 1002b, the first gate line 30a, and the second gate line 30b may be formed as a single layer structure or a multilayer structure. The embodiments of the present disclosure do not specifically limit the materials, structures, and forming methods of the first gate electrode 1002a, the second gate electrode 1002b, the first gate line 30a, and the second gate line 30b.

Figure 8C:
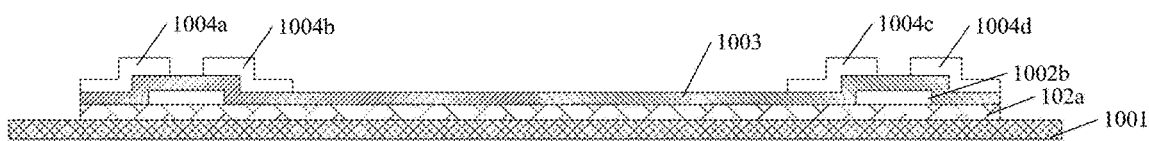

As shown in FIG. 8c, after the first gate electrode 1002a and the second gate electrode 1002b are formed, an active layer 1003 may be formed. For example, an active layer thin film may be formed by a chemical vapor deposition method or the like, and then a patterning process may be performed on the active layer thin film to form the active layer 1003. For example, a material of the active layer 1003 may be an oxide semiconductor material, for example, may be materials such as indium gallium zinc oxide (IGZO), indium zinc oxide (IZO), and zinc oxide (ZnO). Alternatively, the active layer 1003 may also be made of a material such as amorphous silicon, microcrystalline silicon, or polycrystalline silicon. The embodiments of the present disclosure do not specifically limit the material and the forming method of the active layer 1003.

For example, after the active layer 1003 is formed, a first source electrode 1004a, a first drain electrode 1004b, a second source electrode 1004c, and a second drain electrode 1004d may be formed. For example, a source-drain electrode thin film may be formed on the active layer 1003 by a magnetron sputtering method or the like, and then a patterning process may be performed on the source-drain electrode thin film to form the first source electrode 1004a, the first drain electrode 1004b, the second source electrode 1004c, and the second drain electrode 1004d.

For example, while the first source electrode 1004a, the first drain electrode 1004b, the second source electrode 1004c, and the second drain electrode 1004d are formed, a data line 40 (referring to FIG. 5) electrically connected to the first source electrode 1004a and the second drain electrode 1004d may be formed simultaneously, and the data line 40 can be used for transmitting driving signals for the first source electrode 1004a and the second drain electrode 1004d.

For example, a material of the source-drain electrode thin film may be a metal material, for example, may comprise one or more of a group consisting of titanium, tantalum, chromium, aluminum, aluminum alloy, copper, copper alloy, molybdenum, and molybdenum aluminum alloy. The embodiments of the present disclosure do not specifically limit the materials and the forming methods of the source electrodes, the drain electrodes, and the data line.

Figure 8D:
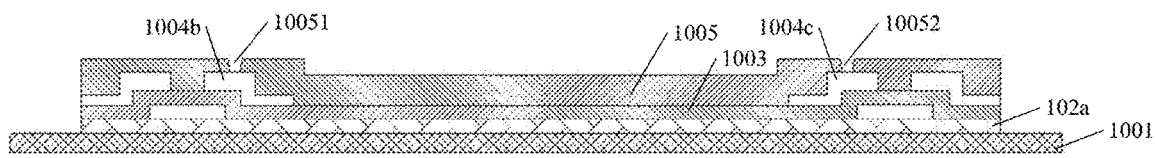

As shown in FIG. 8d, after the first source electrode 1004a, the first drain electrode 1004b, the second source electrode 1004c, and the second drain electrode 1004d are formed, a first insulation layer 1005 may be formed. For example, a first insulation layer thin film may be formed by a chemical vapor deposition method or the like, and then a patterning process may be performed on the first insulation layer thin film to form the first insulation layer 1005. For example, a material of the first insulation layer 1005 may comprise an inorganic material, for example, may comprise one or more of silicon nitride (SiNx), silicon oxide (SiOx), and silicon oxynitride (SiNxOy).

For example, during a process of performing the patterning process on the insulation layer thin film, a first hole 10051 exposing the first drain electrode 1004b and a second hole 10052 exposing the second source electrode 1004c may be formed in the first insulation layer 1005, so as to facilitate to electrically connect the first drain electrode 1004b and the second source electrode 1004c with the other structures in the subsequent process.

Figure 8E:
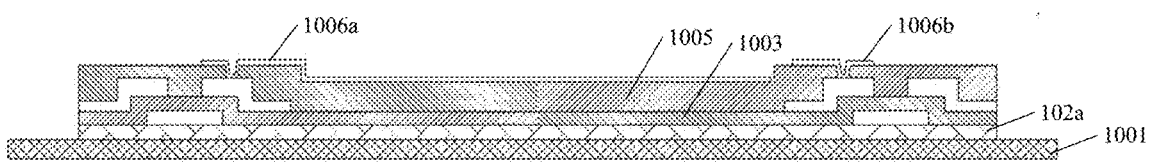

As shown in FIG. 8e, after the first insulation layer 1005 is formed, a second electrode 1006a and a connection electrode 1006b can be formed. For example, an electrode thin film may be formed by a magnetron sputtering method or the like, and then a patterning process may be performed on the electrode thin film to form the second electrode 1006a and the connection electrode 1006b. For example, a material of the electrode thin film may comprise a transparent metal oxide, for example, may comprise a material such as indium tin oxide (ITO) or indium zinc oxide (IZO). The embodiments of the present disclosure do not specifically limit the materials and the forming methods of the second electrode 1006a and the connection electrode 1006b.

Figure 8F:
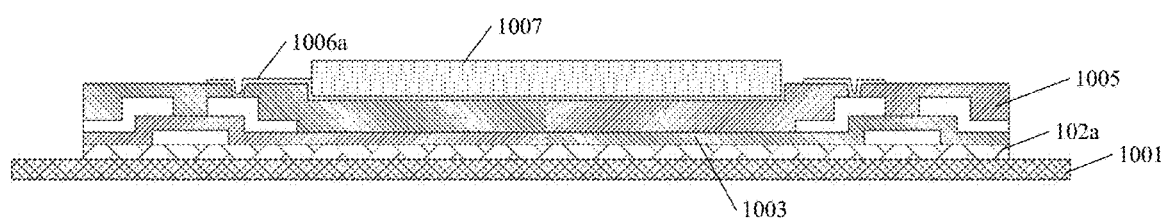

As shown in FIG. 8f, after the second electrode 1006a and the connection electrode 1006b are formed, a first organic light-emitting layer 1007 may be formed. For example, the first organic light-emitting layer 1007 may be formed by a coating method, an inkjet printing method, or the like. For example, the first organic light-emitting layer 1007 may be made of a monochromatic organic light-emitting material, such as a red organic light-emitting material, a green organic light-emitting material, or a blue organic light-emitting material, and a color of the light that can be emitted by the first organic light-emitting layer 1007 should be the same as a color of the light that the first light adjusting component 102a can transmit, so that the light emitted by the first organic light-emitting layer 1007 can be emitted out from the first light adjusting component 102a.

Figure 8G:
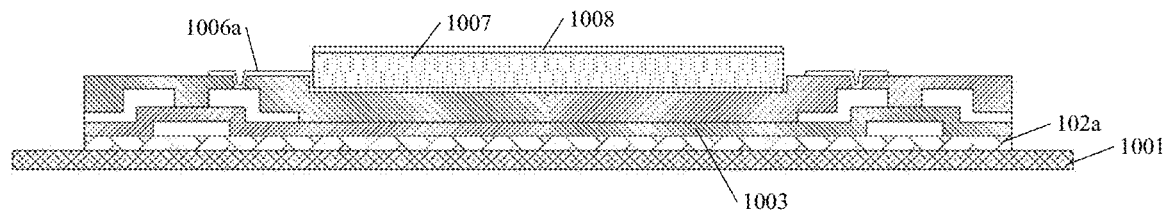

As shown in FIG. 8g, after the first organic light-emitting layer 1007 is formed, a first electrode 1008 may be formed. For example, the first electrode 1008 may be formed by a method such as a magnetron sputtering method or the like. For example, the first electrode may be made of a metal material, for example, may be made of a material such as copper, copper alloy, aluminum, aluminum alloy, magnesium, magnesium alloy, and the first electrode 1008 formed of a metal material can be used as a reflective electrode. For example, the first electrode may also be made of a transparent metal oxide such as ITO, and therefore the formed first electrode may be used as a transparent electrode. The embodiments of the present disclosure do not specifically limit the material and the forming method of the first electrode 1008.

Figure 8H:
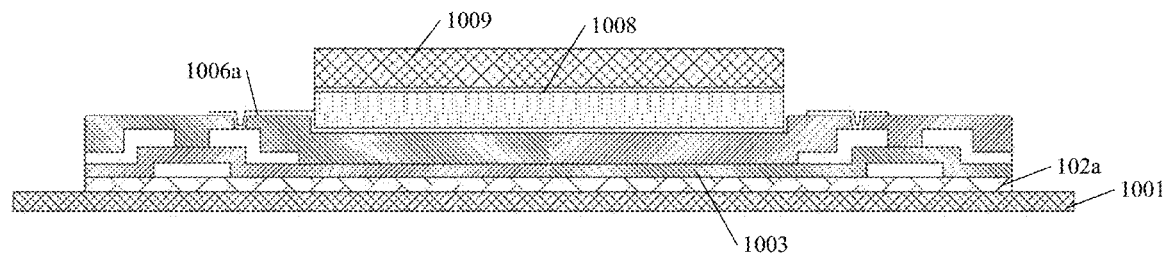

As shown in FIG. 8*h*, after the first electrode 1008 is formed, a second organic light-emitting layer 1009 may be formed. For example, the second organic light-emitting layer 1009 may be formed by a coating method, an inkjet printing method, or the like. For example, the second organic light-emitting layer 1009 may be made of a monochromatic organic light-emitting material, such as a red organic light-emitting material, a green organic light-emitting material, or a blue organic light-emitting material, and a color of the light that can be emitted by the second organic light-emitting layer 1009 should be different from the color of the light that can be emitted by the first organic light-emitting layer 1007, thereby preventing the light emitted by the second organic light-emitting layer 1009 from being emitted out from the first light adjusting component 102*a*.

Figure 8I:
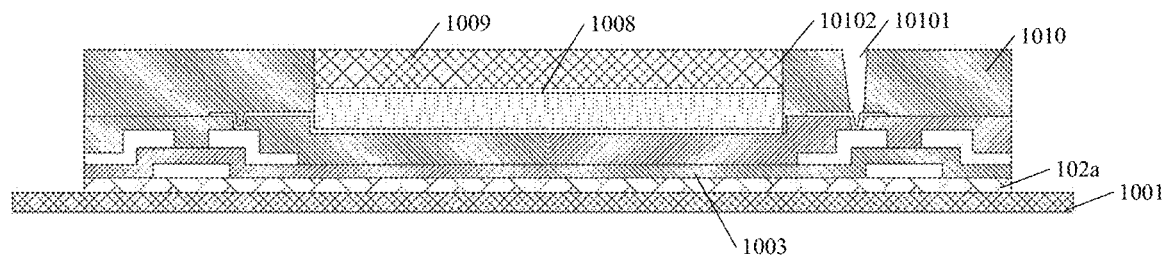

As shown in FIG. 8*i*, after the second organic light-emitting layer 1009 is formed, a pixel defining layer 1010 may be formed. For example, a pixel defining layer thin film may be formed by a method such as a magnetron sputtering method or the like, and then a patterning process may be performed on the pixel defining layer thin film to form the pixel defining layer 1010 which comprises a third hole 10101 and an opening 10102, the third hole 10101 exposes the connection electrode 1006*b*, and the opening 10102 exposes the second organic light-emitting layer 1009. For example, the pixel defining layer 1010 may be formed of an organic insulation material, for example, may be formed of a material such as polyimide (PI). The embodiments of the present disclosure do not specifically limit the material and the forming method of the pixel defining layer 1010.

For example, a plurality of openings 10102 are formed in the pixel defining layer 1010, each opening 10102 corresponds to a pixel unit, the first organic electroluminescent component of the first pixel unit and the second organic electroluminescent component of the second pixel unit which are formed in a stacked manner are formed in the same opening 10102 of the pixel defining layer 1010, so that the pixel defining layer 1010 can separate different pixel units to achieve a function of isolating the pixel units. In addition, the pixel defining layer 1010 may also planarize the functional layers, so as to facilitate the formation of subsequent functional structures.

Figure 8J:
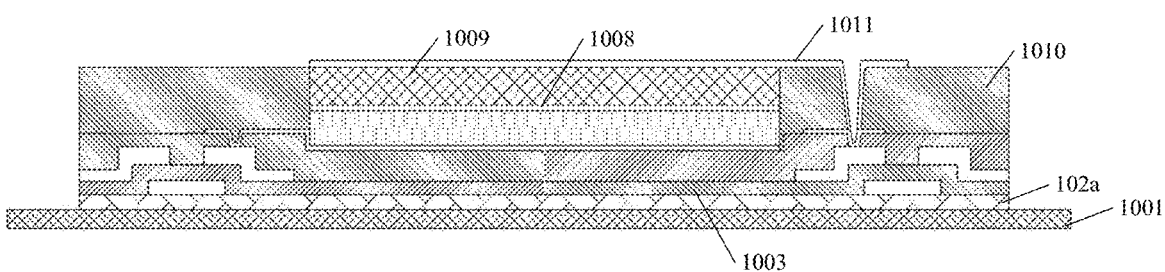

As shown in FIG. 8*j*, after the pixel defining layer 1010 is formed, a third electrode 1011 may be formed. For example, a third electrode thin film may be formed by a method such as a magnetron sputtering method or the like, and then a patterning process may be performed on the third electrode thin film to form the third electrode 1011, the third electrode 1011 is electrically connected to the connection electrode 1006*b* through the third hole 10101, and is also electrically connected to the second source electrode 1004*c*. For example, a material of the third electrode thin film may be a transparent metal oxide, for example, may be a material such as indium tin oxide (ITO) or indium zinc oxide (IZO). The embodiments of the present disclosure do not specifically limit the material and the forming method of the third electrode 1011.

In this example, the second hole 10052 and the third hole 10101 constitute a sleeve hole structure, the connection electrode 1006*b* is formed in the sleeve hole structure to serve as a transition connection structure, so that the third electrode 1011 and the second source electrode 1004*c* are electrically connected effectively, thereby avoiding problems such as poor electrical connection because of alignment deviations of the positions of holes or insufficient deposition depths of materials In this example, the first electrode 1008, the second electrode 1006*b*, and the first organic light-emitting layer 1007 between the first electrode 1008 and the second electrode 1006*b* constitute a first organic electroluminescent component of the first pixel unit in the first display layer; and the first electrode 1008, the third electrode 1011, and the second organic light-emitting layer 1009 between the first electrode 1008 and the third electrode 1011 constitute a second organic electroluminescent component of the second pixel unit in the second display layer. In this example, the first organic electroluminescent component of the first pixel unit and the second organic electroluminescent component of the second pixel unit are stacked in the same opening, and share one first electrode 1008, which makes the preparation process simpler, saves the material and the space, thereby being beneficial to the thin design of the double-sided display panel.

For example, while forming the first electrode 1008, a common power line (not shown) electrically connected to the first electrode 1008 may be formed, and the common power line is used to provide a common voltage. Therefore, the first organic electroluminescent component or the second organic electroluminescent component can be driven to emit light by applying a voltage between the first electrode 1008 and the second electrode 1006*b* or between the first electrode 1008 and the third electrode 1011.

Figure 8K:
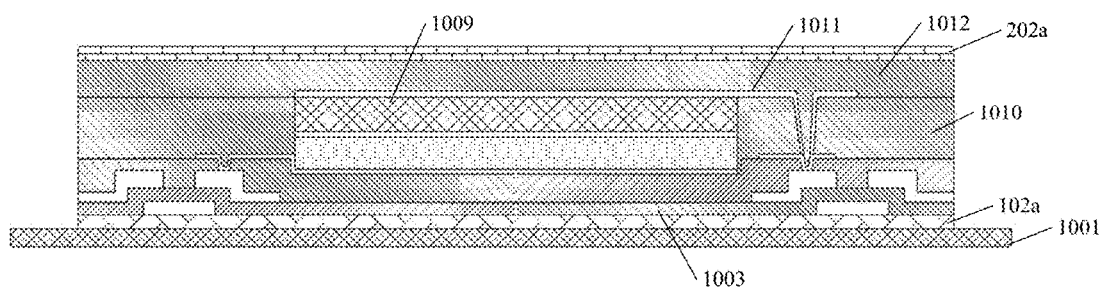

As shown in FIG. 8*k*, after the third electrode 1011 is formed, a second insulation layer 1012 may be formed. For example, a second insulation layer thin film may be formed by a chemical vapor deposition method or the like, and then a patterning process may be performed on the second insulation layer thin film to form the second insulation layer 1012. For example, a material of the second insulation layer 1012 may comprise an inorganic material, for example, may comprise one or more of silicon nitride (SiNx), silicon oxide (SiOx), and silicon oxynitride (SiNxOy). The embodiments of the present disclosure do not specifically limit the material and the forming method of the second insulation layer 1012.

For example, the second insulation layer 1012 may be used to insulate and protect the third electrode 1011, and further achieve planarization of the functional layers to facilitate the subsequent formation of the second light adjusting component 202*a*.

For example, after the second insulation layer 1012 is formed, a second light adjusting component 202*a* may be formed. The second light adjusting component 202*a* constitutes a second display surface of the double-sided display panel. In some embodiments of the present disclosure, the second light adjusting component 202*a* may transmit only light of a color emitted by the second organic light-emitting layer 1009 corresponding to the second light adjusting component 202*a*. For example, the second light adjusting component 202*a* may be various types of light adjusting components such as a photonic crystal, a grating light valve, or a color filter, and the second light adjusting component may be, for example, attached to the second insulation layer 1012 after the second light adjusting component is formed. The specific manufacture method of the second light adjusting component 202a is the same as that of the first light adjusting component 102a, and details are not described herein again.

Figure 8L:
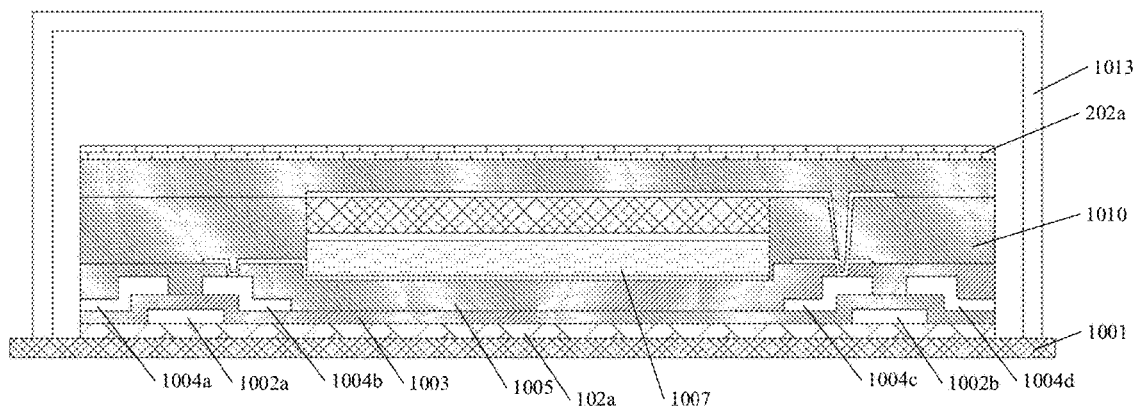

As shown in FIG. 8l, after the second light adjusting component 202a is formed, an encapsulation layer 1013 may be formed. The encapsulation layer 1013 may be made of, for example, an organic material, an inorganic material, or a combination of an organic material and an inorganic material. The encapsulation layer 1013 can protect the overall structure of the double-sided display panel and prevent impurities such as moisture, dust, and the like, in the external environment from entering the inside of the device.

In some embodiments of the present disclosure, other functional structures may be formed in the double-sided display panel according to the requirements, and the embodiments of the present disclosure are not limited thereto.

The above examples are illustrated by taking a case that the first display layer and the second display layer are sequentially formed on the same side of the base substrate as an example. In a case where the first display layer and the second display layer are respectively formed on different sides of the base substrate, the first display layer may be first formed on one side of the base substrate, and then the second display layer may be formed on the other side of the base substrate, the specific manufacture methods of the first display layer and the second display layer can refer to the above embodiments, and details are not described herein again. In this case, the first display layer and the second display layer are separately formed, and can independently display, respectively, thereby achieving a double-sided display effect.

In other examples of the embodiment of the present disclosure, the manufacture method of the double-sided display panel may comprise, for example: providing a first base substrate and a second base substrate, the first display layer being formed on the first base substrate, and the second display layer being formed on the second base substrate; then arranging the first base substrate and the second base substrate in a stacked manner, and allowing light emitted by the first display layer and light emitted by the second display layer to be emitted out from the first base substrate and the second base substrate, respectively.

In this example, in a case of arranging the first base substrate and the second base substrate in a stacked manner, it should be noted that a color of the light emitted by the first pixel unit in the first display layer should be different from a color of the light emitted by the second pixel unit, which is stacked with the first pixel unit, in the second display layer, so that the light emitted by the first pixel unit and the light emitted by the second pixel unit can be emitted out only from the first display surface and the second display surface, respectively, and do not interfere with each other.

In this example, the first display layer and the second display layer may be separately formed on the first base substrate and the second base substrate, respectively, so that the first display layer and the second display layer can independently display, respectively, thereby achieving a double-sided display effect. In this example, the specific manufacture methods of the first display layer and the second display layer can refer to the above embodiments, and details are not described herein.

In the double-sided display panel manufactured by the manufacture method provided by some embodiments of the present disclosure, the first light adjusting component in the first light adjusting component layer can transmit only light of a specific color emitted by the first pixel unit, which corresponds to the first light adjusting component, in the first light-emitting layer, and the second light adjusting component in the second light adjusting component layer can transmit only light of a specific color emitted by the second pixel unit, which corresponds to the second light adjusting component, in the second light-emitting layer, so that the first light-emitting layer and the second light-emitting layer can display independently, thereby achieving a double-sided display effect. In addition, the first light adjusting component and the second light adjusting component can also block or reflect light of other colors, thereby preventing a problem of cross crosstalk between different pixel units; meanwhile, the distance between the pixel units can be reduced, thereby increasing the pixel aperture ratio, and furthermore improving the display effect of the double-sided display panel The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale. However, it should understood that, in the case in which a component or element such as a layer, film, area, substrate or the like is referred to be "on" or "under" another component or element, it may be directly on or under the another component or element or a component or element is interposed therebetween.

(3) In case of no conflict, the embodiments of the present disclosure and the features in the embodiment(s) can be combined with each other to obtain new embodiment(s).

What have been described above are only specific implementations of the present disclosure, the protection scope of the present disclosure is not limited thereto. Any modifications or substitutions easily occur to those skilled in the art within the technical scope of the present disclosure should be within the protection scope of the present disclosure. Therefore, the protection scope of the present disclosure should be based on the protection scope of the claims.

What is claimed is:

1. A double-sided display panel, comprising a first display layer and a second display layer which are disposed opposite to each other, wherein the first display layer comprises:
    a plurality of first pixel units arranged periodically and a plurality of first light adjusting components which are stacked in one-to-one correspondence with the plurality of first pixel units, wherein the plurality of first pixel units are configured to emit first monochromatic light or white light comprising the first monochromatic light, and the plurality of first light adjusting components corresponding to the plurality of first pixel units are configured to transmit only the first monochromatic light or the first monochromatic light in the white light; and the second display layer comprises:
    a plurality of second pixel units arranged periodically and a plurality of second light adjusting components which are stacked in one-to-one correspondence with the plurality of second pixel units, wherein the plurality of second pixel units are configured to emit second monochromatic light or white light comprising the second monochromatic light, and the plurality of second light adjusting components corresponding to the plurality of second pixel units are configured to transmit only the second monochromatic light or the second monochromatic light in the white light;

wherein the double-sided display panel further comprises a base substrate, the first light adjusting component, the first pixel unit, the second pixel unit, and the second light adjusting component are sequentially stacked on the base substrate in a direction from near to far from the base substrate;

the plurality of first pixel units are stacked in one-to-one correspondence with the plurality of second pixel units: orthographic projections of respective one first pixel unit, of the plurality of first pixel units, and respective one second pixel unit, of the plurality of second pixel units, which are correspondingly stacked on the base substrate are overlapped with each other; and respective one first pixel unit of the plurality of first pixel units and respective one second pixel unit, of the plurality of second pixel units, which are correspondingly stacked emit monochromatic light, of different colors, respectively, a color of monochromatic light capable of being transmitted b r a first light adjusting component which is correspondingly stacked with the first pixel unit and a color of monochromatic light capable of being transmitted by a second light adjusting component which is corresponding stacked with the second pixel unit, are different;

the first light adjusting component is configured to only allow the first monochromatic light emitted by the first, pixel unit to pass through, and the second light adjusting component is configured to only allow the second monochromatic light emitted by the second pixel unit to pass through.

2. The double-sided display panel according to claim 1, wherein the first light adjusting component is further configured to reflect light of other colors except the first monochromatic light emitted by the first pixel unit corresponding to the first light adjusting component; and the second light adjusting component is further configured to reflect light of other colors except the second monochromatic light emitted by the second pixel unit corresponding to the second light adjusting component.

3. The double-sided display panel according to claim 2, wherein the first light adjusting component comprises a photonic crystal, a grating light valve, or a color filter; and
the second light adjusting component comprises a photonic crystal, a grating light valve, or a color filter.

4. The double-sided display panel according to claim 3, wherein the photonic crystal comprises a first matrix and a plurality of columnar structures periodically disposed in the first matrix, and a refractive index of the first matrix is different from refractive indexes of the plurality of columnar structures.

5. The double-sided display panel according to claim 1, wherein a plane shape and a plane size of a light-emitting layer of a light-emitting component of the first pixel unit are respectively substantially same as a plane shape and a plane size of a light-emitting layer of a light-emitting component of the second pixel unit which is correspondingly stacked with the first pixel unit;

a plane size of the first light adjusting component is larger than the plane size of the light-emitting layer of the light-emitting component of the first pixel unit correspondingly stacked with the first light adjusting component, and a plane size of the second light adjusting component is larger than the plane size of the light-emitting layer of the light-emitting component of the second pixel unit correspondingly stacked with the second light adjusting component.

6. The double-sided display panel according to claim 5, wherein the plurality of first pixel units of the first display layer comprise a plurality of first red pixel units, a plurality of first green pixel units, and a plurality of first blue pixel units, the plurality of first red pixel units, the plurality of first green pixel units, and the plurality of first blue pixel units are arranged in an array, and colors of two adjacent first pixel units are different; and the plurality of second pixel units of the second display layer comprise a plurality of second red pixel units, a plurality of second green pixel units, and a plurality of second blue pixel units, the plurality of second red pixel units, the plurality of second green pixel units, and the plurality of second blue pixel units are arranged in an array, and colors of two adjacent second pixel units are different.

7. The double-sided display panel according to claim 6, wherein the plurality of first pixel units comprise a plurality of rows of pixel units, every three adjacent first pixel units is a first repeating unit, a first one pixel unit in each first repeating unit is a green pixel unit, a second one pixel unit in each first repeating unit is a blue pixel unit, and a third one pixel unit in each first repeating unit is a red pixel unit;

the plurality of second pixel units comprises a plurality of rows of pixel units, every three adjacent second pixel units is a second repeating unit, a first one pixel unit in each second repeating unit is a red pixel unit, a second one pixel unit in each second repeating unit is a green pixel unit, and a third one pixel unit in each second repeating unit is a blue pixel unit;

the first one pixel unit in the first repeating unit is correspondingly stacked with the first one pixel unit in the second repeating unit;

the second one pixel unit in the first repeating unit is correspondingly stacked with the second one pixel unit in the second repeating unit; and the third one pixel unit in the first repeating unit is correspondingly stacked with the third one pixel unit in the second repeating unit.

8. The double-sided display panel according to claim 1, further comprising a first pixel drive circuit configured to drive the first organic electroluminescent component and a second pixel drive circuit configured to drive the second organic electroluminescent component; wherein the first pixel drive circuit comprises a first drive transistor, and the second pixel drive circuit comprises a second drive transistor;

the first drive transistor and the second drive transistor are in a same layer, and are between the first light adjusting component and the base substrate, the first pixel electrode of the first organic electroluminescent component is connected to a source electrode of the first drive transistor, and the second pixel electrode of the second organic electroluminescent component is connected to a source electrode of the second drive transistor.

9. The double-sided display panel according to claim 1, wherein the cathode is a transparent cathode.

10. The double-sided display panel according to claim 8, further comprising a first gate line and a second gate line which are between adjacent two rows of pixel units, wherein the first gate line is configured to provide a gate signal for first pixel units in one row of the adjacent two rows of pixel units, and the second gate line is configured to provide a gate signal for second pixel units in other row of the adjacent two rows of pixel units.

11. The double-sided display panel according to claim 8, further comprising a data line between adjacent two columns of pixel units, wherein the data line is configured to provide a data signal for first pixel units in one column of the adjacent two columns of pixel units and to provide a data signal for second pixel units in other column of the adjacent two columns of pixel units.

12. The double-sided display panel according to claim 1, further comprising an encapsulation layer on the second light adjusting component.

13. The double-sided display panel according to claim 8, further comprising a pixel defining layer,
    wherein an orthographic projection of the first pixel drive circuit on the base substrate and an orthographic projection of the second pixel drive circuit on the base substrate are located within an orthographic projection of the pixel defining layer on the base substrate.

14. The double-sided display panel according to claim 1, further comprising a first base substrate and a second base substrate,
    wherein the first display layer is on the first base substrate, and the first base substrate is configured to allow light emitted by the first display layer to be emitted out from the first base substrate, the second display layer is on the second base substrate, and the first base substrate and the second base substrate are stacked in a first direction, and the second base substrate is configured to allow light emitted by the second display layer to be emitted out from the second base substrate;
    the first direction is perpendicular to the first base substrate.

15. A double-sided display device, comprising the double-sided display panel according to claim 1.

16. A manufacture method of a double-sided display panel, comprising forming a first display layer and a second display layer which are opposite to each other, wherein
    forming the first display layer comprises:
        forming a plurality of first pixel units arranged periodically and a plurality of first light adjusting components which are stacked in one-to-one correspondence with the plurality of first pixel units, wherein the plurality of first pixel units are configured to emit first monochromatic light or white light comprising the first monochromatic light, and the plurality of first light adjusting components corresponding to the plurality of first pixel units are configured to transmit only the first monochromatic light or the first monochromatic light in the white light; and
    forming the second display layer comprises:
        forming a plurality of second pixel units arranged periodically and a plurality of second light adjusting components which are stacked in one-to-one correspondence with the plurality of second pixel units, wherein the plurality of second pixel units are configured to emit second monochromatic light or white light comprising the second monochromatic light, and the plurality of second light adjusting components corresponding to the plurality of second pixel units are configured to transmit only the second monochromatic light or the second monochromatic light in the white light;
    wherein the method further comprises: providing a base substrate, wherein the first light adjusting component, the first pixel unit, the second pixel unit, and the second light adjusting component are sequentially stacked on the base substrate in a direction from near to far from the base substrate;
    the plurality of first pixel units are stacked in one-to-one correspondence with the plurality of second pixel units; orthographic projections of respective one first pixel unit, of the plurality of first pixel units, and respective one second pixel unit, of the plurality of second pixel units, which are correspondingly stacked on the base substrate are overlapped with each other; and
    respective one first pixel unit, of the plurality of first pixel units, and respective one second pixel unit, of the plurality of second pixel units, which are correspondingly stacked emit monochromatic light of different colors, respectively, a color of monochromatic light capable of being transmitted by a first light adjusting component which is correspondingly stacked with the first pixel unit and a color of monochromatic light capable of being transmitted by a second light adjusting component which is correspondingly stacked with the second pixel unit are different;
    the first light adjusting component is configured to only allow the first monochromatic light emitted by the first pixel unit to pass through and the second light adjusting component is configured to only allow the second monochromatic light emitted by the second pixel unit to pass through.

* * * * *